(12) United States Patent
Hensley et al.

(10) Patent No.: US 7,348,495 B2
(45) Date of Patent: Mar. 25, 2008

(54) UNIFORM FORCE HYDROSTATIC BOLSTER PLATE

(75) Inventors: James David Hensley, Rocklin, CA (US); Michael Alan Brooks, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 560 days.

(21) Appl. No.: 10/773,723

(22) Filed: Feb. 5, 2004

(65) Prior Publication Data

US 2004/0159463 A1 Aug. 19, 2004

Related U.S. Application Data

(62) Division of application No. 09/883,707, filed on Jun. 18, 2001, now Pat. No. 6,711,811.

(51) Int. Cl.
*H05K 1/16* (2006.01)
(52) U.S. Cl. .................. 174/260; 361/760; 361/785
(58) Field of Classification Search .......... 174/260; 361/760, 785–791
See application file for complete search history.

(56) References Cited

U.S. PATENT DOCUMENTS

| 4,033,479 | A | 7/1977 | Fletcher et al. |
| 4,521,829 | A | 6/1985 | Wessely |
| 5,040,051 | A | 8/1991 | Thiel |
| 5,050,051 | A | 9/1991 | Machida et al. |
| 5,160,269 | A | 11/1992 | Fox, Jr. et al. |
| 5,430,611 | A | 7/1995 | Patel et al. |
| 5,608,610 | A | 3/1997 | Brzezinski |
| 6,791,846 | B2 * | 9/2004 | Smith et al. .............. 361/803 |

* cited by examiner

*Primary Examiner*—Jeremy C Norris

(57) ABSTRACT

A method and apparatus to mount a uniform force hydrostatic bolster plate to a substrate. One embodiment of the invention involves a method to assemble a uniform force hydrostatic bolster plate on a substrate. A second embodiment of the invention involves a method to fabricate a uniform force hydrostatic bolster plate. A third embodiment of the invention involves an assembled substrate with a uniform force hydrostatic bolster plate on the opposite side of the assembled substrate, under an electrical contact area of a component on the assembled substrate.

13 Claims, 6 Drawing Sheets

US 7,348,495 B2

UNIFORM FORCE HYDROSTATIC BOLSTER PLATE

CROSS-REFERENCE TO RELATED APPLICATION

This application is a divisional of U.S. application having Ser. No. 09/883,707, by inventors James D. Hensley and Michael A. Brooks, filed on Jun. 18, 2001 now U.S. Pat. No. 6,711,811, which is hereby fully incorporated herein by reference. Benefit of all earlier filing dates is claimed for all common subject matter.

BACKGROUND OF THE INVENTION

1. Field of the Invention

This invention relates generally to a bolster plate to support a substrate subject to high clamping forces for integrated circuit (IC) components, and more specifically relates to a bolster plate to support a printed circuit board assembled with one or more land grid array (LGA) IC components.

2. Description of the Prior Art

In many data processing systems (e.g., computer systems, programmable electronic systems, telecommunication switching systems, control systems, and so forth) very large pin count electrical components (e.g., application specific integrated circuits and processor chips) are assembled on substrates (e.g., printed circuit boards, other flexible substrates, multi-chip modules, and equivalents). One type of packaging that is frequently used for a very large pin count electrical component is what is commonly known as a land grid array (LGA) component. Electrical connections between the LGA component pins and the corresponding conductive pads on the substrate are frequently achieved by compressing an elastomeric insulating material containing several perpendicular conductive channels (e.g., buttons or columns filled with conductive balls or conductive threads).

In order to achieve reliable electrical connection between the pins and the pads, such LGA components are clamped by bolts to the substrate with high perpendicular clamping forces (exceeding several hundred pounds or several hundred newtons of force). However, such large perpendicular forces can cause distortion in the normally flat substrate, and the lack of flatness can cause poor electrical contacts that produce a permanent or an intermittent failure in system operation. Therefore, a bolster plate is frequently attached under a LGA component clamped area of the substrate to support the substrate. The bolster plate provides extra rigidity to the substrate, and the bolster plate helps to maintain the flatness of the substrate under the LGA component.

FIG. 1 illustrates a conventional bolster plate 102 assembled under a substrate (e.g., a printed circuit board) 104, opposite to the attachment of a LGA component 106 by clamp 108 into a socket 110 on the top of the substrate 104. The conventional bolster plate 102 is designed to provide flatness and rigidity to the substrate 104, and provide a uniform load distribution across the contact region of the LGA component 106 when the clamp (e.g., a heat-sink, a heat-pipe, a cooling fan, a mechanical clamp, and equivalents) 108 is bolted to the substrate 104 by bolts 114 and springs 112.

Conventional bolster plates are typically fabricated from a thick, heavy metal plate coated with one or more insulating layers, or they are fabricated from an expensive thermosetcomposite material (e.g., a graphite fiber epoxy composite). Conventional bolster plates also need a very precise flatness tolerance to insure uniform mechanical support. Additionally, such bolster plates are constrained in thickness and dimensions by the increasing packing densities of nearby substrates. Thick and heavy bolster plates may touch and damage adjacent components on adjacent substrates, and can be especially detrimental td system reliability when the system is subject to shock and vibration. However, thin and light bolster plates may distort and fail to adequately support the substrate when high clamping forces are used for high pin count LGA components. Since the pin counts for IC components are continually increasing, clamping forces for LGA components and the resulting substrate distortions are also increasing. Without an improved bolster plate to counter such distortions, there will be an increasing number of poor electrical contacts between LGA components and the substrates, resulting in increasing operational and reliability failures.

It would be desirable to provide an improved bolster plate that can supply the necessary uniform mechanical support to a substrate, and maintain the desired flatness of the electrical contact area under an IC component. In addition, this improved bolster plate would preferably be formed from thinner material, due to the reduction in open space adjacent to the substrate in a computer system.

SUMMARY OF THE INVENTION

The present invention provides an improved bolster plate that can supply the necessary uniform mechanical support to a substrate, and maintain the desired flatness of the electrical contact area under an IC component. In addition, this improved bolster plate can be formed from thinner material, compared to the material needed in a conventional bolster plate.

A first aspect of the invention is directed to a method to assemble a uniform force hydrostatic bolster plate to one side of a substrate having a first side and a second side. The method includes attaching a component to an electrical contact area on the second side of the substrate; filling a bladder with a material; inserting the bladder into an hollow plate; and attaching the bladder and the hollow plate to the first side of the substrate, wherein the bladder and the hollow plate are attached to the first side of the substrate opposite the electrical contact area on the second side of the substrate.

A second aspect of the invention is directed to a method to fabricate a uniform force hydrostatic bolster plate. The method includes selecting a set of physical dimensions for a bladder and a hollow plate incorporated in the uniform force hydrostatic bolster plate; modeling the uniform force hydrostatic bolster plate after an assembly on a substrate; estimating an improved set of physical dimensions for the bladder and the hollow plate after modeling the uniform force hydrostatic bolster plate after assembly of the uniform force bolster plate and a component on the substrate; fabricating a bladder prototype and a hollow plate prototype according to the improved set of physical dimensions; and putting the bladder prototype filled with a substantially non-compressible material into the hollow plate prototype, such that the bladder prototype extends in height above the hollow plate prototype.

A third aspect of the invention is directed to an assembled substrate. The assembled substrate includes a substrate having a first and a second side, and an electrical contact area on the first side; an electrical component having a plurality of leads attached to the electrical contact area of the substrate; and a uniform force hydrostatic bolster plate attached to the second side of the substrate opposite the electrical contact area of the substrate, wherein the uniform force hydrostatic bolster plate includes a bladder, a material inside the bladder, and an hollow plate to enclose the bladder, wherein the hollow plate is open on one side.

DETAILED DESCRIPTION OF PREFERRED EMBODIMENTS OF THE INVENTION

The present invention provides an improved bolster plate that is relatively thinner and lighter in weight than conventional bolster plates. This improved bolster plate is attached to a substrate under an electrical component mounted on the substrate, such as a printed circuit board (PCB) or multi-chip module. While the discussion below is directed to an application of the invention to an LGA assembled on a substrate (e.g., a PCB), the invention can also be applied to other types of electrical components assembled on a distortable substrate (e.g., flexible substrates, and other substrates upon which electrical components can be assembled).

Figure 1:
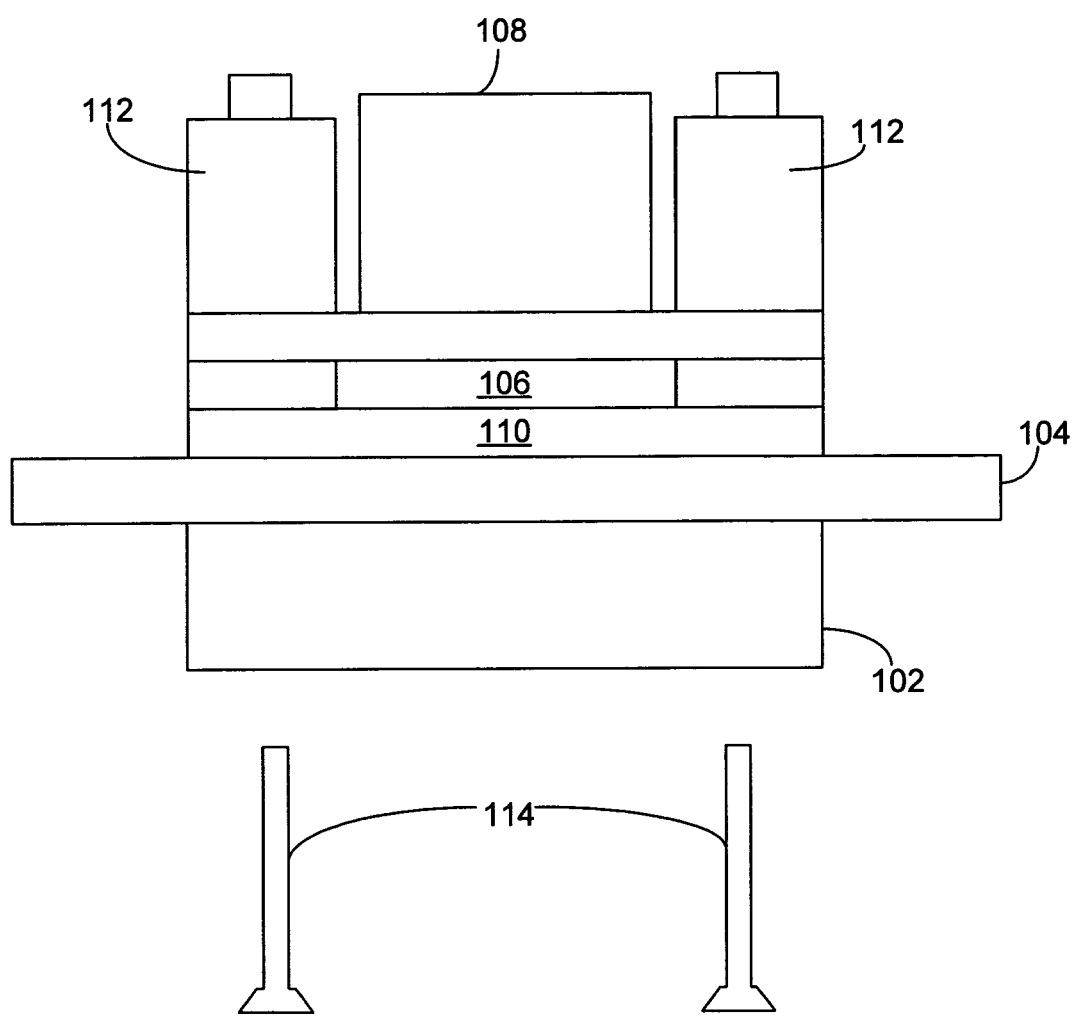
FIG. 1 illustrates a conventional bolster plate assembled under a printed circuit board (PCB), opposite to the attachment of a LGA component to the top of the PCB.
Figure 2:
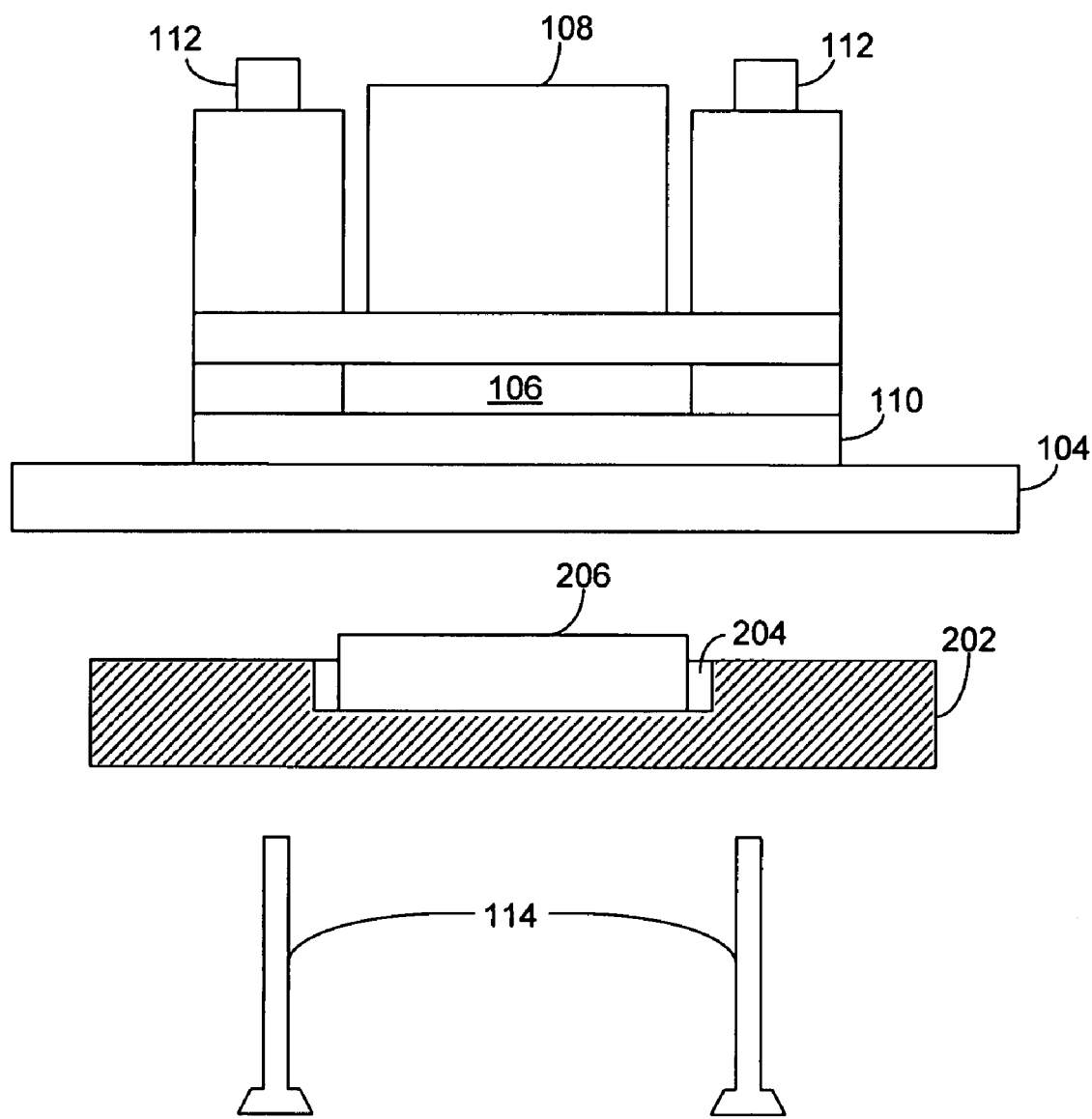
FIG. 2 illustrates one embodiment of a uniform force hydrostatic bolster plate prior to assembly under a substrate (e.g., a PCB), opposite to the attachment of a LGA component to the top of the substrate.

FIG. 2 illustrates one embodiment of a uniform force hydrostatic bolster plate prior to assembly under a substrate (e.g., a PCB) 104, opposite to the attachment of a LGA component 106 to the top of the substrate 104. This illustrated embodiment of a uniform force hydrostatic bolster plate includes a hollow plate 202, a cavity 204 in the hollow plate 202, and a bladder 206 filled with a non-compressible fluid. The LGA component 106 is inserted in a socket 110, and the LGA component 106 is clamped to the substrate 104 by clamp 108. The clamping of the LGA component 106 is complete when the clamp 108 is bolted to the substrate 104 by bolts 114 and springs 112. The uniform force hydrostatic bolster plate 202 is designed to provide flatness and rigidity to the substrate 104, and provide a uniform load distribution across the contact region of the LGA component 106.

The hollow plate 202 can be fabricated from the following materials: a stainless steel alloy, a titanium steel alloy, a spring steel alloy, a magnesium alloy, an aluminum alloy, a composite, or a plastic. One preferred embodiment of the invention has a hollow plate fabricated from a stainless steel alloy. Stainless steel is corrosion resistant and would not require plating or painting after stamping. Stainless steel also has sufficient strength and stiffness, and would not require any heat treatment. The hollow plate 202 is designed to contain a bladder that will counteract the perpendicular clamping force to provide flatness and rigidity to the PCB 104, and provide a uniform load distribution across the contact region of the LGA component 106.

Figure 3:
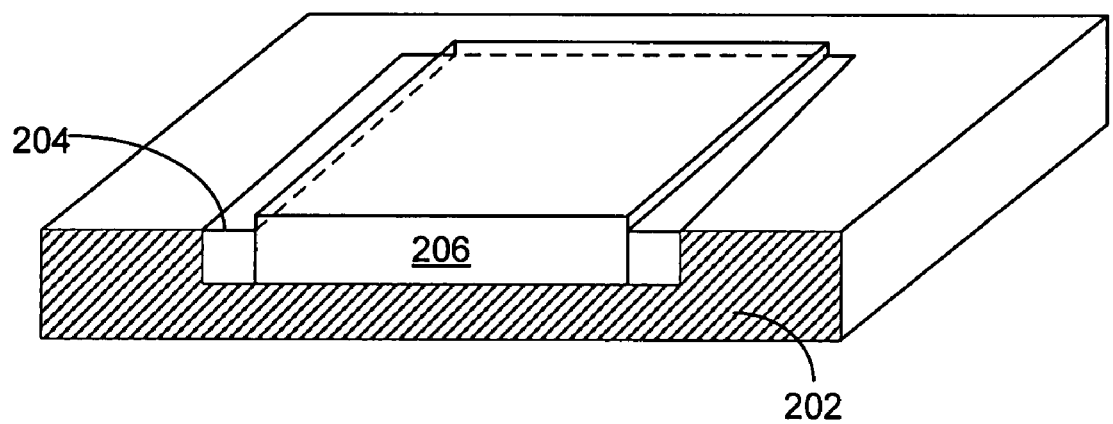
FIG. 3 illustrates in a perspective view one embodiment of a uniform force hydrostatic bolster plate with a hollow plate, a cavity in the hollow plate, and a fluid-filled bladder.

FIG. 3 illustrates in a perspective view one embodiment of a uniform force hydrostatic bolster plate with a hollow plate 202, a cavity 204 in the hollow plate, and a fluid-filled bladder 206. The bladder liquid can be water, a glycol solution, an oil mixture, a water-based gel, or an oil-based gel. The bladder liquid is preferably relatively non-compressible, non-flammable, and non-corrosive. The bladder bag is also preferably relatively non-compressible, non-flammable, and non-corrosive. The bladder bag preferably includes an impermeable elastomeric material (e.g., a plastic, a rubber, or a fabric).

Since the height of the bladder 206 is slightly higher than the hollow plate 202, and the bladder liquid and bladder bag conform to the surface of the substrate (not shown), a tight tolerance in flatness is not necessary for the hollow plate. The hollow plate 202 of the uniform force hydrostatic bolster plate can be molded at a much lower cost than a conventional machined bolster plate. An alternative embodiment of the invention uses a stamped metal hollow plate, which is still normally lower in cost than a machined bolster plate.

Figure 4:
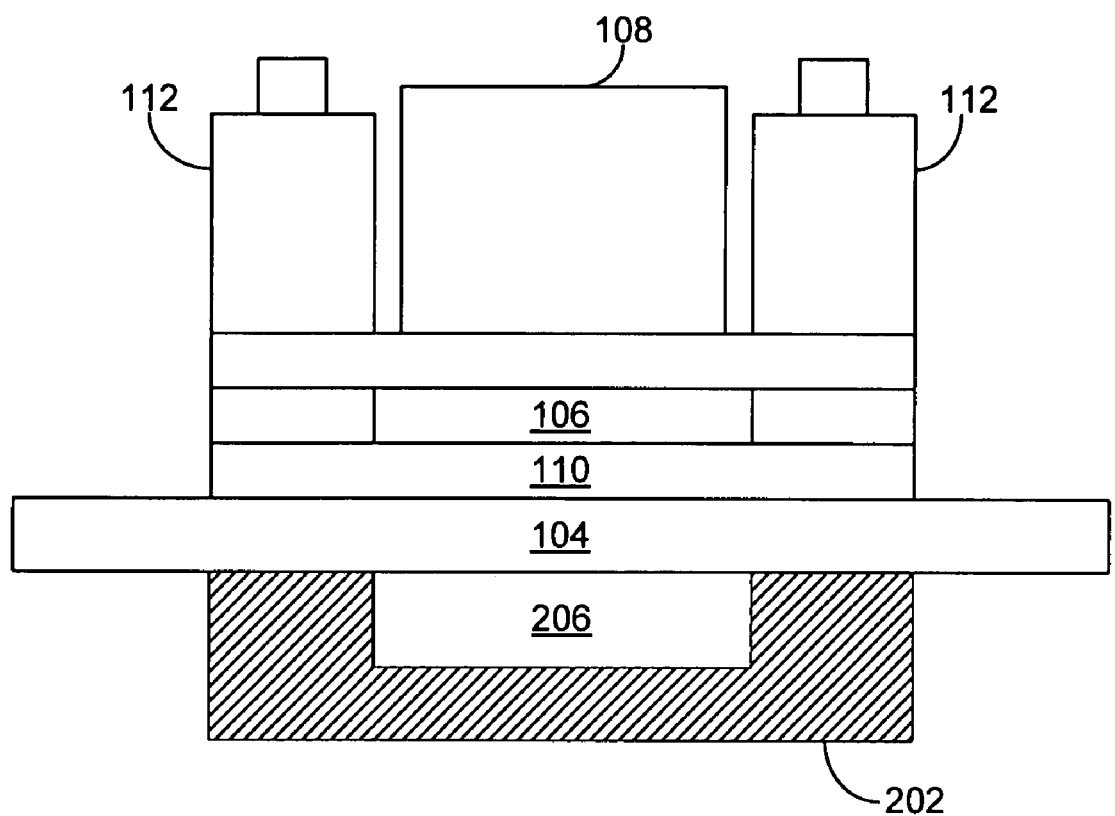
FIG. 4 illustrates a cross-sectional side view of a uniform force hydrostatic bolster plate with a bladder that conforms to a substrate during the application of the perpendicular clamping force between the substrate and the uniform force hydrostatic bolster plate.

FIG. 4 illustrates a cross-sectional side view of a uniform force hydrostatic bolster plate with a bladder 206 that conforms to a substrate 104 during the application of the perpendicular clamping force between the substrate 104 and the uniform force hydrostatic bolster plate. The LGA component 106 is inserted in a socket 110, and the LGA component 106 is clamped to the substrate 104 by clamp 108. The clamping of the LGA component 106 is complete when the clamp 108 is bolted to the substrate 104 by bolts 114 (shown in FIG. 2) and springs 112. This illustrated embodiment of a uniform force hydrostatic bolster plate includes a hollow plate 202, a cavity (shown in FIG. 2 and FIG. 3) in the hollow plate 202, and a bladder 206 filled with a non-compressible fluid. Since the bladder 206 extended above the hollow plate 202 before final assembly to the substrate 104, the cavity 204 shown in FIG. 2 and FIG. 3 is completely filled by the bladder 206 after final assembly of the uniform force hydrostatic bolster plate to the substrate 104.

Figure 5:
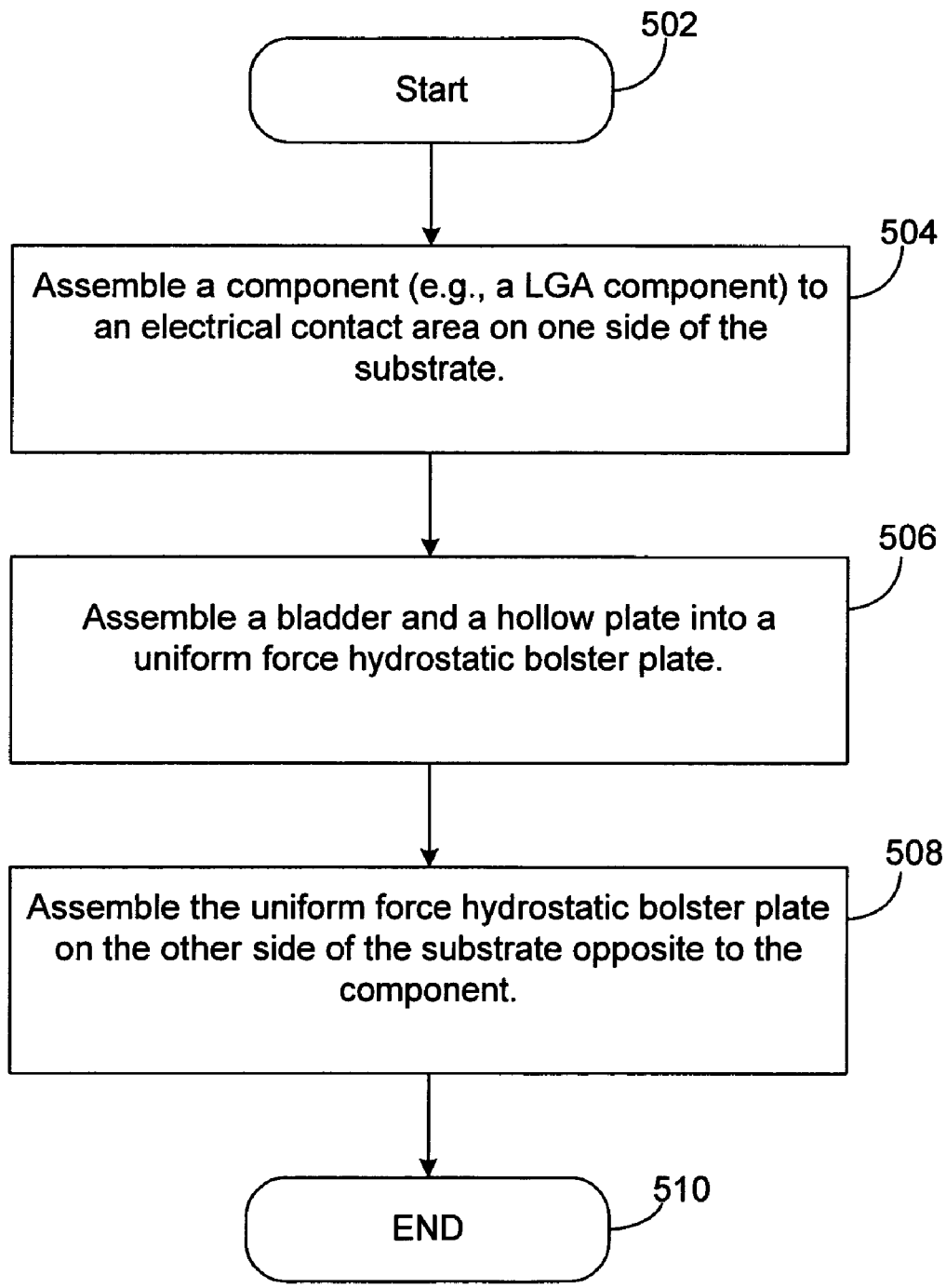
FIG. 5 shows one flow chart for a method to assemble a uniform force hydrostatic bolster plate on a substrate as shown in FIG. 2 in accordance with one embodiment of the present invention.

FIG. 5 shows one flow chart for a method to assemble a uniform force hydrostatic bolster plate on a substrate as shown in FIG. 2 in accordance with one embodiment of the present invention. The method starts in operation 502, and is followed by operation 504. In operation 504, a component is attached to the electrical contact area on one side of a substrate. In operation 506, a fluid-filled bladder and a hollow plate are assembled into a uniform force hydrostatic bolster plate. In operation 508, the uniform force hydrostatic bolster plate is attached opposite the component and electrical contact area on the first side of the substrate. Operation 510 is the end of the method.

Figure 6:
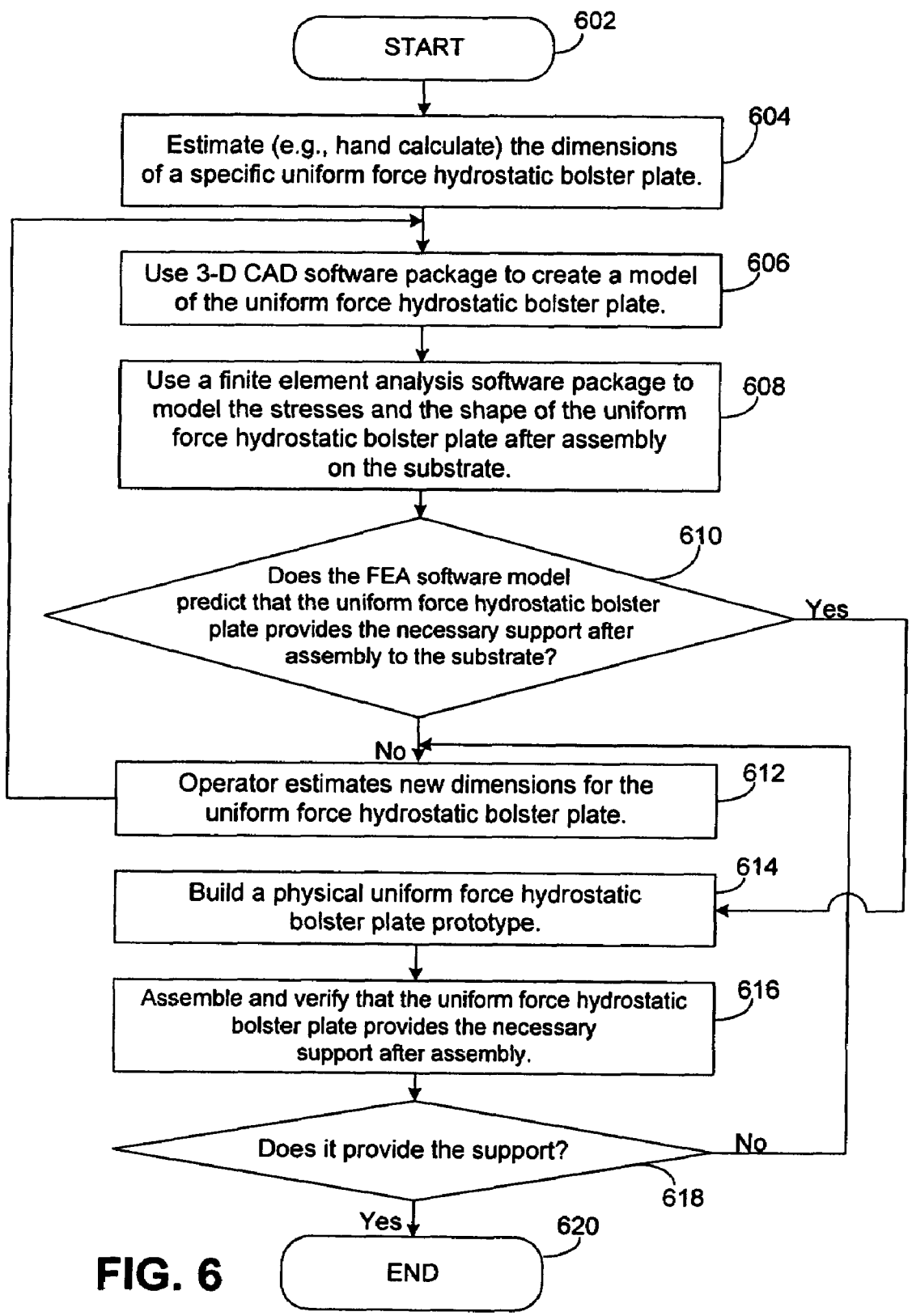
FIG. 6 shows a flow chart for a method to fabricate a uniform force hydrostatic bolster plate in accordance with one preferred embodiment of the present invention.

FIG. 6 shows a flow chart for a method to fabricate a uniform force hydrostatic bolster plate in accordance with one preferred embodiment of the present invention. The method starts in operation 602, and is followed by operation 604. In operation 604, an estimate (e.g., a hand calculation) is made of the physical dimensions needed for a bladder and a hollow plate that make a uniform force hydrostatic bolster plate under a uniform load predicted from the clamping force that will be applied to the LGA component assembled on a substrate. In operation 606, a 3-Dimensional computer aided design (CAD) software package (e.g., Pro/ENGINEER, available from PTC Corporation with corporate headquarters in Needham, Massachusetts; SolidDesigner, available from CoCreate Software, Inc. with corporate headquarters in Fort Collins, Colo.; SolidWorks, available from SolidWorks Corporation with corporate headquarters in Concord, Mass.; or an equivalent CAD package) is used to create a model of the uniform force hydrostatic bolster plate assuming the previously selected physical dimensions of the bladder and the hollow plate. Then operation 608 is next. In operation 608, a finite element analysis (FEA) software package (e.g., Pro/MECHANICA, available from PTC Corporation with corporate headquarters in Needham, Mass.; Ansys, available from Ansys, Inc. with corporate headquarters in Canonsburg, Pa.; Cosmos, available from Structural Research & Analysis Corporation with corporate headquarters in Los Angeles, Calif.; or an equivalent FEA package) is used to model the stresses and the predict the final shape of the uniform force hydrostatic bolster plate after assembly of the uniform force hydrostatic bolster plate and the component to the substrate. In operation 610, a test is made to determine if the FEA software package predicts that that the uniform force hydrostatic bolster plate maintains a uniform force after assembly. If the test of operation 610 determines that the uniform force hydrostatic bolster plate will not provide a uniform force, operation 612 is next where the operator decides on a new set of physical dimensions for the bladder and hollow plate. Then operations 606, 608, and 610 are repeated. If the test of the operation 610 determines that the uniform force hydrostatic bolster plate will provide the necessary support after assembly under the component, then operation 614 is next. In operation 614 a uniform force hydrostatic bolster plate prototype, including a bladder prototype and hollow plate prototype, is fabricated. Operation 616 is next, where the uniform force hydrostatic bolster plate prototype is assembled to the substrate to verify that the uniform force hydrostatic bolster plate prototype will provide a uniform force. Then operation 618 is next, where a test is made to determine if the uniform force hydrostatic bolster plate prototype provides a satisfactory amount of support. If the test of operation 618 verifies that the uniform force hydrostatic bolster plate prototype does not provide a satisfactory amount of support, then operation 612 is next. If the test of operation 618 verifies that the uniform force hydrostatic bolster plate prototype is satisfactory, then the method ends in operation 620.

The embodiments of the invention discussed above mainly described examples of substrates assembled with LGA components. However, alternative embodiments of the invention can be applied to other components (e.g., clamped IC components, transformers, power supplies, connectors, or other devices that can cause substrate distortion by an attachment force, clamping force, or from the weight of the component).

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. An assembled substrate, comprising:
   a substrate having a first side and a second side, and an electrical contact area comprising conductive pads on said first side;
   an electrical component having a plurality of leads comprising component pins attached to said conductive pads of said substrate;
   a socket disposed on the substrate, wherein the electrical component is disposed on the socket; and
   a uniform force hydrostatic bolster plate attached to said second side of said substrate opposite said electrical contact area of said substrate, wherein said uniform force hydrostatic bolster plate includes:
   a bladder,
   a material inside said bladder, and
   a hollow plate to enclose said bladder, wherein said hollow plate is open on one side and wherein the bladder conforms to a surface of the substrate.

2. The assembled substrate of claim 1, wherein said substrate is chosen from a group of substrates consisting of: a printed circuit board (PCB), a multi-chip module (MCM), and a flexible substrate.

3. The assembled substrate of claim 1, wherein said component is a land grid array (LGA) component.

4. The assembled substrate of claim 1, wherein said uniform force hydrostatic bolster plate includes a hollow plate fabricated from a material selected from a group of materials consisting of: a stainless steel alloy, a powder-coated spring steel alloy, a plated spring steel alloy, a painted spring steel alloy, a titanium steel alloy, a magnesium alloy, an aluminum alloy, or a plastic.

5. The assembled substrate of claim 1, wherein said material of said bladder incorporates a substantially non-compressible liquid.

6. The assembled substrate of claim 1, wherein said bladder is made from an impermeable elastomeric material chosen from a group of impermeable elastomeric materials consisting of: a plastic, a rubber, or a fabric.

7. The assembled substrate of claim 1, wherein said material inside said bladder is selected from a group of materials consisting of: water, a glycol solution, an oil mixture, a water-based gel, or an oil-based gel.

8. The assembled substrate of claim 1, wherein the bladder has a height that extends above a height of the hollow plate before the hollow plate is attached to the substrate.

9. The assembled substrate of claim 1, wherein the bladder conforms to the surface of the substrate after the hollow plate is attached to the substrate.

10. The assembled substrate of claim 1, wherein bladder physical dimensions for the bladder are estimated and plate physical dimensions for the hollow plate are estimated, based upon a predicted uniform load from a clamping force that is applied to the component and the substrate that is coupled to the component and the hollow plate.

11. The assembled substrate of claim 10, wherein the hollow plate is modeled in a three-dimensional computer aided design software, based on the bladder physical dimensions and plate physical dimensions.

12. The assembled substrate of claim 11, wherein a finite element analysis software package models stresses on the hollow plate and determines a shape of the hollow plate, after the hollow plate is assembled on the substrate.

13. The assembled substrate of claim 12, wherein new bladder physical dimensions and new plate physical dimensions are selected if the finite element analysis software package does not predict the hollow plate as maintaining a uniform force after the hollow plate is assembled on the substrate.

* * * * *